(12) United States Patent
Huang et al.

(10) Patent No.: US 11,700,688 B2
(45) Date of Patent: Jul. 11, 2023

(54) DISPLAY SUBSTRATE, METHOD FOR MANUFACTURING THE SAME AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Yongchao Huang, Beijing (CN); Qinghe Wang, Beijing (CN); Haitao Wang, Beijing (CN); Jun Liu, Beijing (CN); Jun Cheng, Beijing (CN); Ce Zhao, Beijing (CN); Liangchen Yan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/183,909

(22) Filed: Feb. 24, 2021

(65) Prior Publication Data

US 2021/0267053 A1  Aug. 26, 2021

(30) Foreign Application Priority Data

Feb. 24, 2020 (CN) .......................... 202010112313.1

(51) Int. Cl.
*H05K 1/09* (2006.01)
*H05K 3/04* (2006.01)

(52) U.S. Cl.
CPC ................. *H05K 1/09* (2013.01); *H05K 3/04* (2013.01); *H05K 2201/10128* (2013.01)

(58) Field of Classification Search
CPC ... H05K 1/09; H05K 3/04; H05K 2201/10128
(Continued)

(56) References Cited

U.S. PATENT DOCUMENTS

2015/0253915 A1   9/2015   Hoang et al.
2016/0357081 A1   12/2016  Li
(Continued)

FOREIGN PATENT DOCUMENTS

CN     104536207 A     4/2015
CN     109326614 A     2/2019

OTHER PUBLICATIONS

First Office Action for Chinese Application No. 202010112313.1, dated Jul. 20, 2022, 7 Pages.

*Primary Examiner* — Tremesha S Willis
(74) *Attorney, Agent, or Firm* — Brooks Kushman P.C.

(57) ABSTRACT

The present disclosure provides a display substrate, a method for manufacturing the display substrate, and a display device. The display substrate includes a first conductive line extending in a first direction on a base substrate, a second conductive line extending in a second direction crossing the first direction on the base substrate, and an insulation layer arranged between the first conductive line and the second conductive line. The display substrate further includes a buffer layer arranged between the first conductive line and the base substrate, a groove extending in the first direction is formed in the buffer layer, the first conductive line is arranged in the groove, and a surface of the first conductive line away from the base substrate is flush with a surface of the buffer layer away from the base substrate.

14 Claims, 6 Drawing Sheets

(58) Field of Classification Search
USPC .......................................................... 174/251
See application file for complete search history.

(56) References Cited

U.S. PATENT DOCUMENTS

2020/0119054 A1    4/2020  Fang et al.
2022/0157709 A1*   5/2022  Shih .................. H01L 21/76802

* cited by examiner

DISPLAY SUBSTRATE, METHOD FOR MANUFACTURING THE SAME AND DISPLAY DEVICE

CROSS-REFERENCE TO RELATED APPLICATION

This application claims priority to Chinese patent application No. 202010112313.1, filed on Feb. 24, 2020, which is incorporated herein by reference in its entirety.

TECHNICAL FIELD

The present disclosure relates to the field of display technology, in particular to a display substrate, a method for manufacturing the display substrate, and a display device.

BACKGROUND

Along with an increase in the resolution of a display device, such a new technology as Touch and Display Driver Integration (TDDI) has been used and a driving circuitry has become more complex, so inevitably metal driving lines (e.g., gate lines and data lines) cross each other at various regions of the display device, especially a Low Temperature Poly Silicon (LTPS) product.

SUMMARY

In a first aspect, the present disclosure provides in some embodiments a display substrate, including a first conductive line extending in a first direction on a base substrate, a second conductive line extending in a second direction crossing the first direction on the base substrate, and an insulation layer arranged between the first conductive line and the second conductive line. The display substrate further includes a buffer layer arranged between the first conductive line and the base substrate, a groove extending in the first direction is formed in the buffer layer, the first conductive line is arranged in the groove, and a surface of the first conductive line away from the base substrate is flush with a surface of the buffer layer away from the base substrate.

In a possible embodiment of the present disclosure, the first conductive line crosses the second conductive line at a target region, the first conductive line includes a first portion arranged at the target region and a second portion other than the first portion, and a surface of the first portion in contact with the insulation layer is parallel to the base substrate.

In a possible embodiment of the present disclosure, a surface of the insulation layer adjacent to the base substrate at the target region is parallel to the base substrate, and a surface of the insulation layer away from the base substrate at the target region is parallel to the base substrate.

In a possible embodiment of the present disclosure, a support pattern is further arranged in the groove and at a side of the first conductive line facing the base substrate, and an orthogonal projection of the support pattern onto the base substrate is located within an orthogonal projection of the first conductive line onto the base substrate.

In a possible embodiment of the present disclosure, the first conductive line includes a third portion and a fourth portion, a surface of the third portion away from the base substrate is flush with a surface of the fourth portion away from the base substrate, and an orthogonal projection of the third portion onto the base substrate coincides with the orthogonal projection of the support pattern onto the base substrate.

In a possible embodiment of the present disclosure, the support pattern is a conductive pattern.

In a second aspect, the present disclosure provides in some embodiments a method for manufacturing a display substrate, including: providing a base substrate; forming a first conductive line extending in a first direction on the base substrate; forming an insulation layer covering the first conductive line on the base substrate; and forming a second conductive line extending in a second direction crossing the first direction on the insulation layer. Prior to forming the first conductive line extending in the first direction on the base substrate, the method further includes: forming a buffer material layer on the base substrate; and etching the buffer material layer to form a buffer layer including a groove extending in the first direction. The forming the first conductive line extending in the first direction on the base substrate includes forming the first conductive line in the groove in such a manner that a surface of the first conductive line away from the base substrate is flush with a surface of the buffer layer away from the base substrate.

In a possible embodiment of the present disclosure, the first conductive line crosses the second conductive line at a target region, the first conductive line includes a first portion arranged at the target region and a second portion other than the first portion, and a surface of the first portion in contact with the insulation layer is parallel to the base substrate.

In a possible embodiment of the present disclosure, a surface of the insulation layer adjacent to the base substrate at the target region is parallel to the base substrate, and a surface of the insulation layer away from the base substrate at the target region is parallel to the base substrate.

In a possible embodiment of the present disclosure, prior to forming the buffer material layer on the base substrate, the method further includes: forming a support material layer on the base substrate; and etching the support material layer to form a support pattern. The etching the buffer material layer to form the buffer layer includes: etching the buffer material layer to form the buffer layer in such a manner that an orthogonal projection of the support pattern onto the base substrate is located within an orthogonal projection of the groove onto the base substrate.

In a possible embodiment of the present disclosure, the forming the first conductive line extending in the first direction on the base substrate includes: forming a first conductive material layer covering the groove on the base substrate; and etching the first conductive material layer to form the first conductive line in such a manner that the orthogonal projection of the support pattern onto the base substrate is located within an orthogonal projection of the first conductive line onto the base substrate.

In a possible embodiment of the present disclosure, portions of the first conductive line in the groove include a third portion and a fourth portion, a surface of the third portion away from the base substrate is flush with a surface of the fourth portion away from the base substrate, and an orthogonal projection of the third portion onto the base substrate coincides with the orthogonal projection of the support pattern onto the base substrate.

In a possible embodiment of the present disclosure, the etching the first conductive material layer to form the first conductive line includes etching the first conductive material layer using a half-tone mask plate to remove a portion of the first conductive material layer at a side of the buffer layer away from the base substrate.

In a third aspect, the present disclosure provides in some embodiments a display device including the above-mentioned display substrate.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
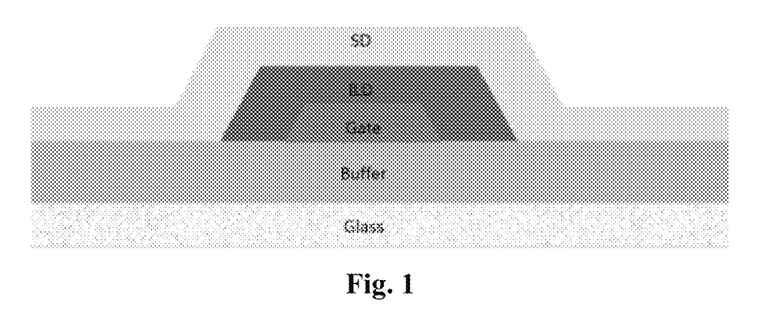
FIG. 1 is a schematic view showing structures between a gate line and a data line in the related art.

In the related art, as shown in FIG. 1, a gate line extending in a first direction is arranged on a buffer layer, and an insulation layer (i.e., Inter Layer Dielectric (ILD)) covers the gate line, so as to enable the gate line to be insulated from a data line. It can be seen that, the gate line includes a sharp end at a position where it crosses the data line, leading to electrostatic breakdown as well as Data-Gate Short (DGS), and thereby leading to a display abnormality.

Figure 2:
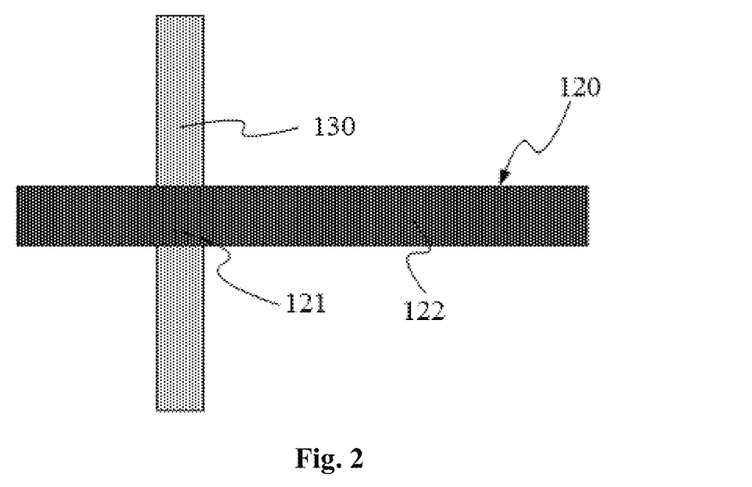
FIG. 2 is a schematic view showing a first conductive line and a second conductive line in a display substrate according to one embodiment of the present disclosure.
Figure 3:
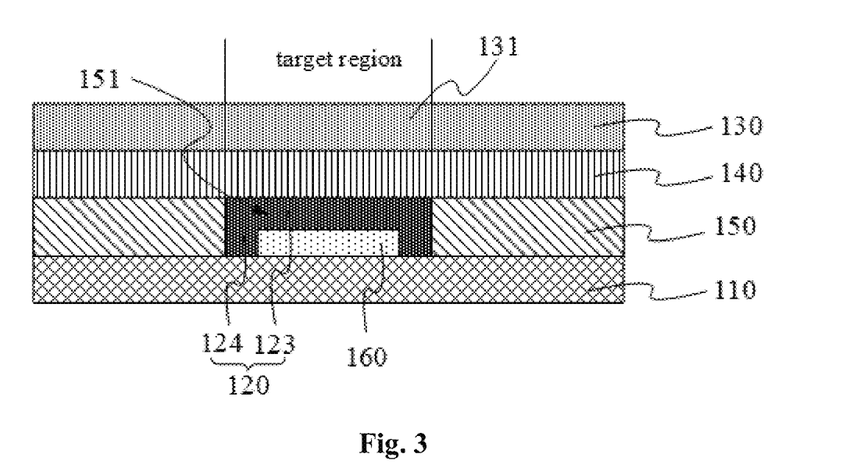
FIG. 3 is a schematic view showing the display substrate according to one embodiment of the present disclosure.

In order to solve the above problem, the present disclosure provides in some embodiments a display substrate which, as shown in FIGS. 2 and 3, includes a first conductive line 120 extending in a first direction on a base substrate 110, a second conductive line 130 extending in a second direction crossing the first direction on the base substrate, and an insulation layer 140 arranged between the first conductive line 120 and the second conductive line 130. The display substrate further includes a buffer layer 150 arranged between the first conductive line 120 and the base substrate 110, a groove 151 extending in the first direction is formed in the buffer layer, the first conductive line 120 is arranged in the groove 151, and a surface of the first conductive line 120 away from the base substrate 110 is flush with a surface of the buffer layer 150 away from the base substrate 110.

In the embodiments of the present disclosure, the first conductive line 120 may be accommodated in the groove 151. Two opposite groove walls of the groove 151 may be parallel to each other, or angled relative to each other, which will not be particularly defined herein. In addition, a height of the first conductive line 120 in a direction perpendicular to the base substrate 110 may be smaller than or equal to a height of the buffer layer 150 in the direction perpendicular to the base substrate 110.

In the embodiments of the present disclosure, after the formation of the groove 151 in the buffer layer 150, the first conductive line 120 may be accommodated in the groove 151, and the surface of the first conductive line 120 away from the base substrate 110 may be flush with the surface of the buffer layer 150 away from the base substrate 110, so that a surface of the first conductive line 120 in contact with the insulation layer 140 may be parallel to the base substrate 110.

Through the above structure, it is able to prevent the occurrence of electrostatic breakdown caused by a sharp end of the first conductive line 120, thereby to prevent a short circuit occurring at a position where the first conductive line crosses the second conductive line, and improve the reliability of a display device.

It should be appreciated that, the groove 151 may be formed inside the buffer layer 150, i.e., a height of the groove 151 in the direction perpendicular to the base substrate 110 may be smaller than the height of the buffer layer 150 in the direction perpendicular to the base substrate 110. Alternatively, the groove 151 may also be formed through the buffer layer 150, i.e., the groove wall of the groove 151 may be the buffer layer 150, and a groove bottom of the groove 151 may be a film layer at a side of the base substrate 110 adjacent to the buffer layer 150.

In some embodiments of the present disclosure, the first conductive line 120 may cross the second conductive line 130 at a target region, the first conductive line 120 may include a first portion 121 arranged at the target region and a second portion 122 other than the first portion 121, and a surface of the first portion 121 in contact with the insulation layer may be parallel to the base substrate.

As shown in FIG. 3, the surface of the first conductive line 120, i.e., the surface of the first portion 121, in contact with the insulation layer 140 may be parallel to the base substrate, different from FIG. 1 where a part of a surface of the insulation layer in contact with the gate line is not parallel to the base substrate.

In the embodiments of the present disclosure, the display substrate includes the first conductive line and the second conductive line extending in different directions and crossing each other at the target region. A surface of the first portion of the first conductive line at the target region and in contact with the insulation layer may be parallel to the base substrate, so it is able to prevent the occurrence of the electrostatic breakdown due to the sharp end of the first portion, thereby to prevent the short circuit occurring at the position where the first conductive line crosses the second conductive line, and improve the reliability of the display device.

The display substrate may be a flexible or rigid display substrate. When the display substrate is the flexible display substrate, the base substrate 110 may be a flexible base substrate, e.g., a polyimide thin film. When the display substrate is the rigid display substrate, the base substrate 110 may be a rigid base substrate, e.g., a quartz or glass substrate.

The first conductive line 120 and the second conductive line 130 may be two adjacent conductive lines extending in different directions and arranged at different layers, e.g., a gate line and a data line connected to a same Thin Film Transistor (TFT).

As shown in FIG. 2, the first conductive line 120 may include the first portion 121 at the target region and the second portion 122 other than the first portion. As shown in FIG. 3, the surface of the first portion 121 in contact with the insulation layer 140 may be parallel to the base substrate 110, so that the insulation layer 140 is a flat structure at the target region. In other words, at the target region, a surface of the insulation layer 140 adjacent to the base substrate 110 may be parallel to the base substrate 110, and a surface of the insulation layer 140 away from the base substrate 110 may be parallel to the base substrate 110. In this regard, for a target portion 131 of the second conductive line 131 subsequently formed on the insulation layer 140 and at the target region, its surface adjacent to the first conductive line 120 may be parallel to the base substrate 110.

When a surface of the first portion 121 of the first conductive line 120 adjacent to the second conductive line 130 is parallel to the base substrate 110 and a surface of the target portion 131 of the second conductive line 130 adjacent to the first conductive line 120 is parallel to the base substrate 110, an equal distance may be provided between the first portion 121 and the target portion 131, so as to prevent the occurrence of the electrostatic breakdown due to the sharp end, thereby to prevent the short circuit occurring at the position where the first conductive line 120 crosses the second conductive line 130, and improve the reliability of the display device.

As shown in FIG. 3, a support pattern 160 may be further arranged in the groove 151 and at a side of the first conductive line 120 facing the base substrate 110, and an orthogonal projection of the support pattern onto the base substrate may be located within an orthogonal projection of the first conductive line onto the base substrate.

In some embodiments of the present disclosure, the first conductive line 120 may include a third portion 123 and a fourth portion 124, a surface of the third portion 123 away from the base substrate 110 may be flush with a surface of the fourth portion 124 away from the base substrate, and an orthogonal projection of the third portion 123 onto the base substrate 110 may coincide with the orthogonal projection of the support pattern 160 onto the base substrate 110.

Figure 4:
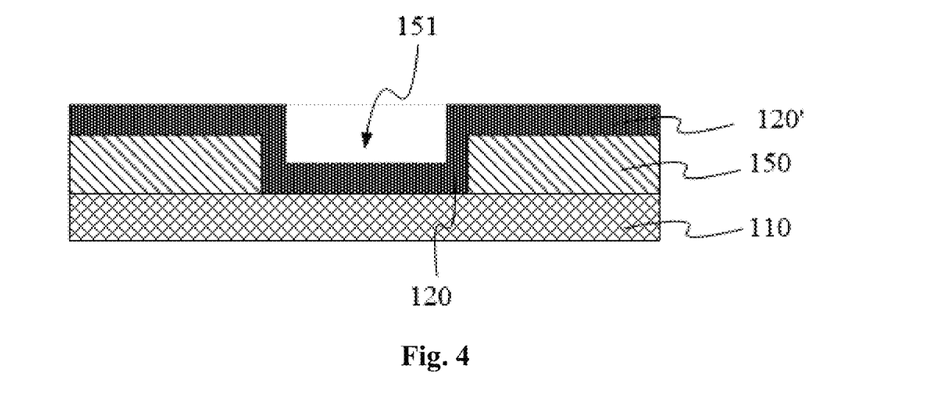
FIG. 4 is a schematic view showing the formation of a first conductive material layer on a display substrate in the related art.

In the embodiments of the present disclosure, the support pattern 160 may be formed prior to the first conductive line 120, i.e., the support pattern 160 may occupy a part of the groove 151, so as to, when a first conductive material layer 120' covering the buffer layer 150 is formed during the formation of the first conductive line 120, prevent the occurrence of such a problem that a distance between a surface of a portion of the first conductive material layer 120' corresponding to the groove 151 away from the base substrate and the base substrate 110 is smaller than a distance between a surface of the buffer layer 150 away from the base substrate and the base substrate 110 due to too little of the first conductive material layer 120' in the groove 151, as shown in FIG. 4.

Figure 5:
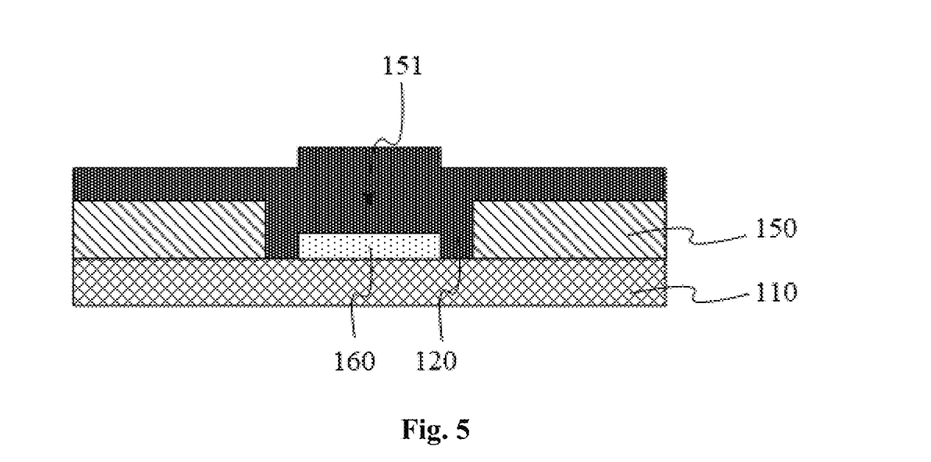
FIG. 5 is a schematic view showing the formation of a first conductive material layer on the display substrate according to one embodiment of the present disclosure.

Through the additional support pattern 160, the distance between the surface of the portion of the first conductive material layer 120' corresponding to the groove 151 away from the base substrate and the base substrate 110 may be larger than the distance between the surface of the buffer layer 150 away from the base substrate and the base substrate 110, as shown in FIG. 5. Subsequently, the first conductive material layer outside the groove 151 may be removed through etching, so that the surface of the first conductive line 120 away from the base substrate 110 may be flush with the surface of the buffer layer 150 away from the base substrate 110.

The support pattern 160 may be located in the middle of the groove, as shown in FIG. 3, i.e., the fourth portion 124 may be arranged at two sides of the third portion 123 in a direction parallel to the base substrate. The support pattern 160 may also be attached to a side wall of the groove, i.e., the fourth portion 124 may be arranged at a side of the third portion 123 in the direction parallel to the base substrate. In addition, the support pattern 160 may also cover the bottom of the entire groove, and at this time, the portion of the first conductive line in the groove may merely include the third portion.

Further, the support pattern 160 may be a conductive pattern.

The support pattern 160 may be connected to the first conductive line 120, and as a conductive pattern, it may also be used to transmit a signal on the first conductive line 120. This is equivalent to increasing a thickness of the first conductive line 120 in the groove 151, so it is able to reduce the electrical resistivity for the signal transmission, and enable the signal to be normally transmitted on the first conductive line 120.

Figure 6:
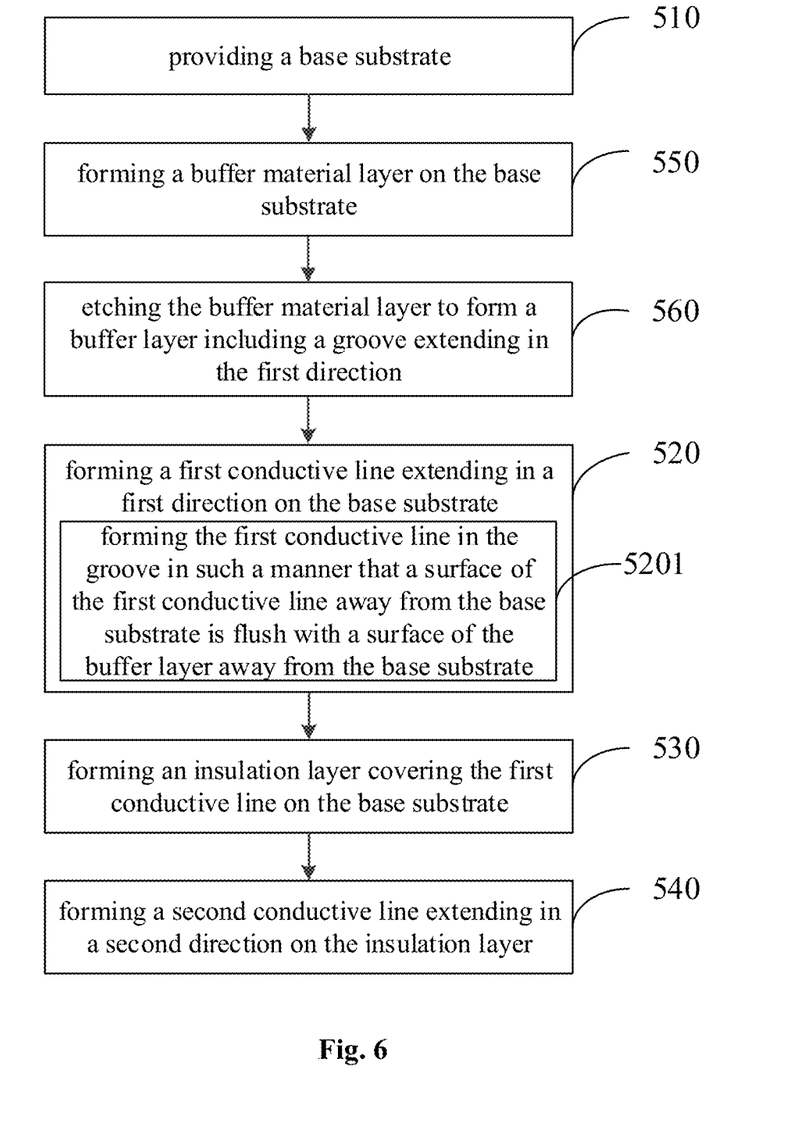
FIG. 6 is a flow chart of a method for manufacturing the display substrate according to one embodiment of the present disclosure.

The present disclosure further provides in some embodiments a method for manufacturing a display substrate which, as shown in FIG. 6, includes: Step 510 of providing a base substrate; Step 520 of forming a first conductive line extending in a first direction on the base substrate; Step 530 of forming an insulation layer covering the first conductive line on the base substrate; and Step 540 of forming a second conductive line extending in a second direction crossing the first direction on the insulation layer. Prior to Step 520 of forming the first conductive line extending in the first direction on the base substrate, the method further includes: Step 550 of forming a buffer material layer on the base substrate; and Step 560 of etching the buffer material layer to form a buffer layer including a groove extending in the first direction. The forming the first conductive line extending in the first direction on the base substrate includes Step 5201 of forming the first conductive line in the groove in such a manner that a surface of the first conductive line away from the base substrate is flush with a surface of the buffer layer away from the base substrate.

Figure 7A:
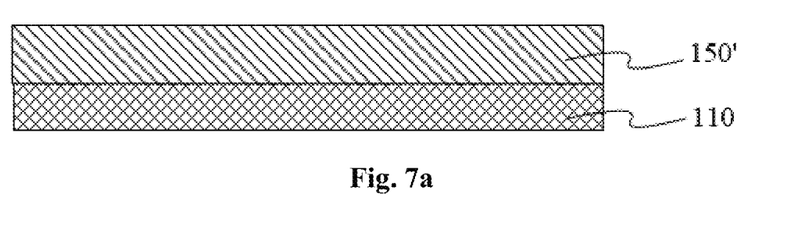
FIGS. 7a-7d are schematic views showing the formation of a buffer layer and a first conductive line according to one embodiment of the present disclosure.
Figure 7B:
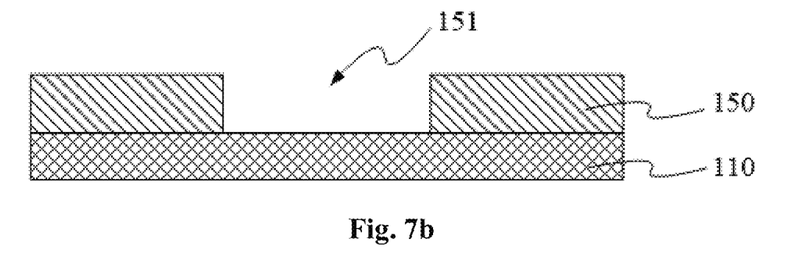

In the embodiments of the present disclosure, after the formation of the buffer material layer 150' on the base substrate, as shown in FIG. 7a, the buffer material layer 150' may be exposed through a mask plate, and then developed to acquire the buffer layer 150 with the groove 151 extending in the first direction, as shown in FIG. 7b.

Figure 7C:
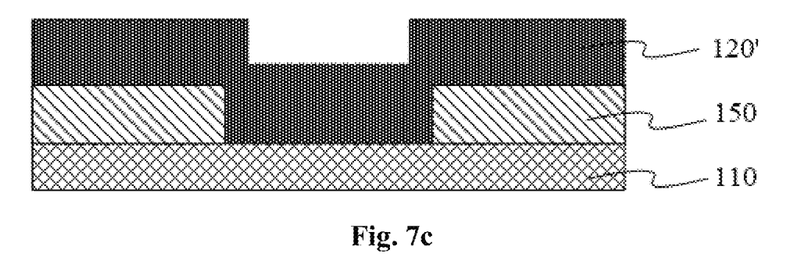
Figure 7D:
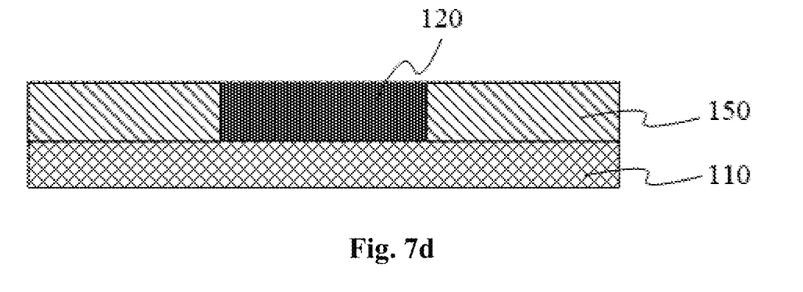

Subsequently, the first conductive material layer 120' covering the buffer 150 may be formed, as shown in FIG. 7c, and then the first conductive material layer 120' outside the groove 151 may be etched, so as to acquire the first conductive line 120 whose surface away from the base substrate 110 is flush with the surface of the buffer layer 150 away from the base substrate 110, as shown in FIG. 7d.

As shown in FIG. 3, in the embodiments, the first conductive line 120 may be accommodated in the groove 151. Two opposite groove walls of the groove 151 may be parallel to each other, or angled relative to each other, which will not be particularly defined herein. In addition, a height of the first conductive line 120 in a direction perpendicular to the base substrate 110 may be smaller than or equal to a height of the buffer layer 150 in the direction perpendicular to the base substrate 110.

In the embodiments of the present disclosure, after the formation of the groove 151 in the buffer layer 150, the first conductive line 120 may be accommodated in the groove 151, and the surface of the first conductive line 120 away from the base substrate 110 may be flush with the surface of the buffer layer 150 away from the base substrate 110, so that a surface of the first conductive line 120 in contact with the insulation layer 140 may be parallel to the base substrate 110.

Through the above structure, it is able to prevent the occurrence of electrostatic breakdown caused by a sharp end of the first conductive line 120, thereby to prevent a short circuit occurring at a position where the first conductive line crosses the second conductive line, and improve the reliability of a display device.

It should be appreciated that, the groove 151 may be formed inside the buffer layer 150, i.e., a height of the groove 151 in the direction perpendicular to the base substrate 110 may be smaller than the height of the buffer layer 150 in the direction perpendicular to the base substrate 110. Alternatively, the groove 151 may also be formed through the buffer layer 150, i.e., the groove wall of the groove 151 may be the buffer layer 150, and a groove bottom of the groove 151 may be a film layer at a side of the base substrate 110 adjacent to the buffer layer 150.

In some embodiments of the present disclosure, the first conductive line 120 may cross the second conductive line 130 at a target region, the first conductive line 120 may include a first portion 121 arranged at the target region and a second portion 122 other than the first portion 121, and a surface of the first portion 121 in contact with the insulation layer may be parallel to the base substrate.

As shown in FIG. 3, the surface of the first conductive line 120, i.e., the surface of the first portion 121, in contact with the insulation layer 140 may be parallel to the base substrate, different from FIG. 1 where a part of a surface of the insulation layer in contact with the gate line is not parallel to the base substrate.

In the embodiments of the present disclosure, the display substrate includes the first conductive line and the second conductive line extending in different directions and crossing each other at the target region. A surface of the first portion of the first conductive line at the target region and in contact with the insulation layer may be parallel to the base substrate, so it is able to prevent the occurrence of the electrostatic breakdown due to the sharp end of the first portion, thereby to prevent the short circuit occurring at the position where the first conductive line crosses the second conductive line, and improve the reliability of the display device.

As shown in FIG. 2, the display substrate may be a flexible or rigid display substrate. When the display substrate is the flexible display substrate, the base substrate 110 may be a flexible base substrate, e.g., a polyimide thin film. When the display substrate is the rigid display substrate, the base substrate 110 may be a rigid base substrate, e.g., a quartz or glass substrate.

The first conductive line 120 and the second conductive line 130 may be two adjacent conductive lines extending in different directions and arranged at different layers, e.g., a gate line and a data line connected to a same TFT.

As shown in FIG. 2, the first conductive line 120 may include the first portion 121 at the target region and the second portion 122 other than the first portion. As shown in FIG. 3, the surface of the first portion 121 in contact with the insulation layer 140 may be parallel to the base substrate 110, so that the insulation layer 140 is a flat structure at the target region. In other words, at the target region, a surface of the insulation layer 140 adjacent to the base substrate 110 may be parallel to the base substrate 110, and a surface of the insulation layer 140 away from the base substrate 110 may be parallel to the base substrate 110. In this regard, for a target portion 131 of the second conductive line 131 subsequently formed on the insulation layer 140 and at the target region, its surface adjacent to the first conductive line 120 may be parallel to the base substrate 110.

When a surface of the first portion 121 of the first conductive line 120 adjacent to the second conductive line 130 is parallel to the base substrate 110 and a surface of the target portion 131 of the second conductive line 130 adjacent to the first conductive line 120 is parallel to the base substrate 110, an equal distance may be provided between the first portion 121 and the target portion 131, so as to prevent the occurrence of the electrostatic breakdown due to the sharp end, thereby to prevent the short circuit occurring at the position where the first conductive line 120 crosses the second conductive line 130, and improve the reliability of the display device.

Prior to forming the buffer material layer on the base substrate, the method may further include: forming a support material layer on the base substrate; and etching the support material layer to form a support pattern. The etching the buffer material layer to form the buffer layer may include: etching the buffer material layer to form the buffer layer in such a manner that an orthogonal projection of the support pattern onto the base substrate is located within an orthogonal projection of the groove onto the base substrate.

In some embodiments of the present disclosure, the orthogonal projection of the support pattern onto the base substrate may be located within an orthogonal projection of the first conductive line onto the base substrate.

Figure 8A:
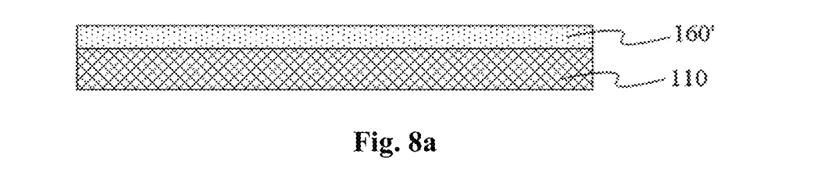
FIGS. 8a to 8g are schematic views showing the formation of corresponding structures according to one embodiment of the present disclosure.
Figure 8B:
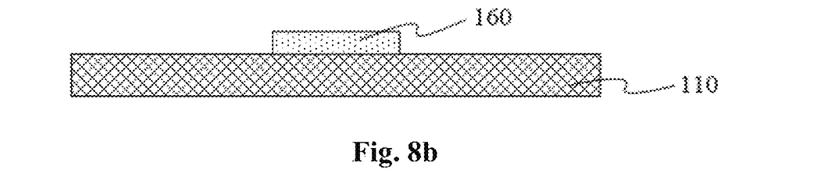

In the embodiments of the present disclosure, after the formation of the support material layer 160' on the base substrate, as shown in FIG. 8a, the support material layer 160' may be exposed through a mask plate, and then developed to acquire the support pattern 160, as shown in FIG. 8b.

In the embodiments of the present disclosure, the support pattern 160 may be formed prior to the first conductive line 120, i.e., the support pattern 160 may occupy a part of the groove 151, so as to, when a first conductive material layer 120' covering the buffer layer 150 is formed during the formation of the first conductive line 120, prevent the occurrence of such a problem that a distance between a surface of a portion of the first conductive material layer 120' corresponding to the groove 151 away from the base substrate and the base substrate 110 is smaller than a distance between a surface of the buffer layer 150 away from the base substrate and the base substrate 110 due to too little of the first conductive material layer 120' in the groove 151, as shown in FIG. 4.

Through the additional support pattern 160, the distance between the surface of the portion of the first conductive material layer 120' corresponding to the groove 151 away from the base substrate and the base substrate 110 may be larger than the distance between the surface of the buffer layer 150 away from the base substrate and the base substrate 110, as shown in FIG. 5. Subsequently, the first conductive material layer outside the groove 151 may be removed through etching, so that the surface of the first conductive line 120 away from the base substrate 100 may be flush with the surface of the buffer layer 150 away from the base substrate 110.

Further, the support pattern 160 may be a conductive pattern.

The support pattern 160 may be connected to the first conductive line 120, and as a conductive pattern, it may also be used to transmit a signal on the first conductive line 120. This is equivalent to increasing a thickness of the first conductive line 120 in the groove 151, so it is able to reduce the electrical resistivity for the signal transmission, and enable the signal to be normally transmitted on the first conductive line 120.

Further, the forming the first conductive line extending in the first direction on the base substrate may include: forming a first conductive material layer covering the groove on the base substrate; and etching the first conductive material layer to form the first conductive line in such a manner that the orthogonal projection of the support pattern onto the base substrate is located within an orthogonal projection of the first conductive line onto the base substrate.

In some embodiments of the present disclosure, portions of the first conductive line in the groove may include a third portion and a fourth portion, a surface of the third portion away from the base substrate may be flush with a surface of the fourth portion away from the base substrate, and an orthogonal projection of the third portion onto the base substrate may coincide with the orthogonal projection of the support pattern onto the base substrate.

Figure 8C:
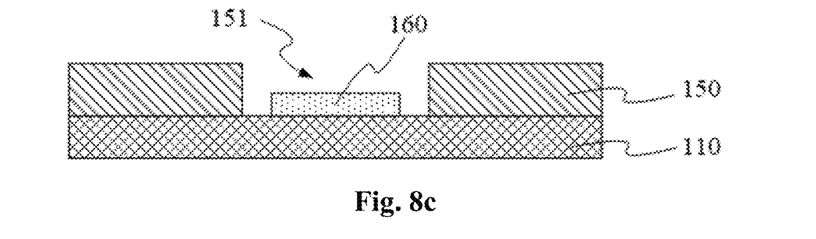

On the basis of FIG. 8*b*, a structure of the buffer layer 150 in FIG. 8*c* may be formed using the methods in FIGS. 7*a* and 7*b*.

Figure 8D:
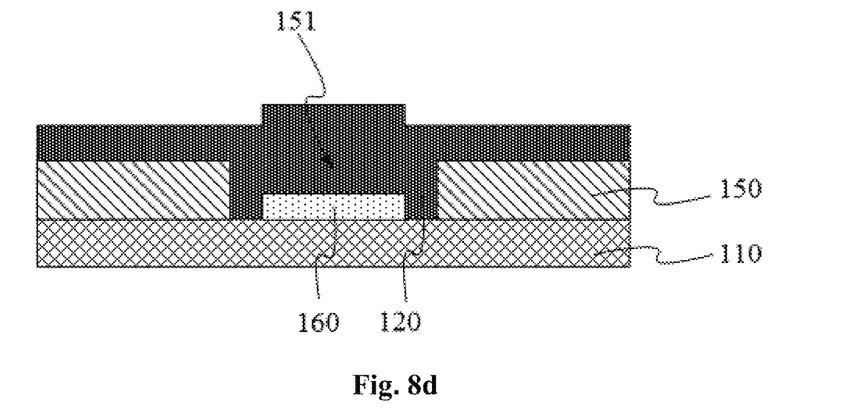
Figure 8E:
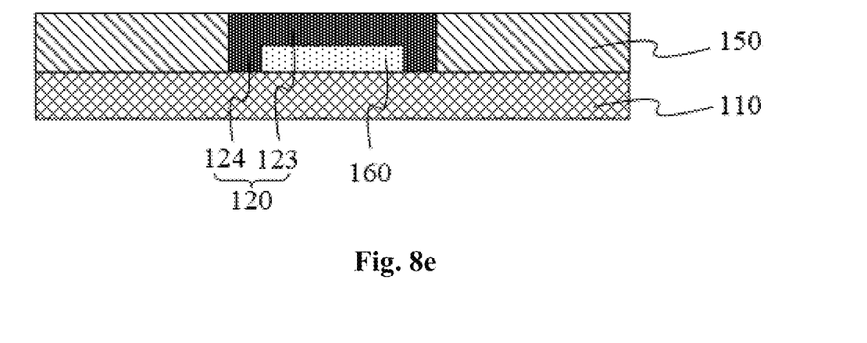

The first conductive material layer 120' covering the groove may be formed on the structure in FIG. 8*c*, as show in FIG. 8*d*, and then the first conductive material layer 120' may be etched to form the first conductive line 120, as shown in FIG. 8*e*.

The support pattern 160 may be located in the middle of the groove, as shown in FIG. 3, i.e., the fourth portion 124 may be arranged at two sides of the third portion 123 in a direction parallel to the base substrate. The support pattern 160 may also be attached to a side wall of the groove, i.e., the fourth portion 124 may be arranged at a side of the third portion 123 in the direction parallel to the base substrate. In addition, the support pattern 160 may also cover the bottom of the entire groove, and at this time, the portion of the first conductive line in the groove may merely include the third portion.

Figure 8F:
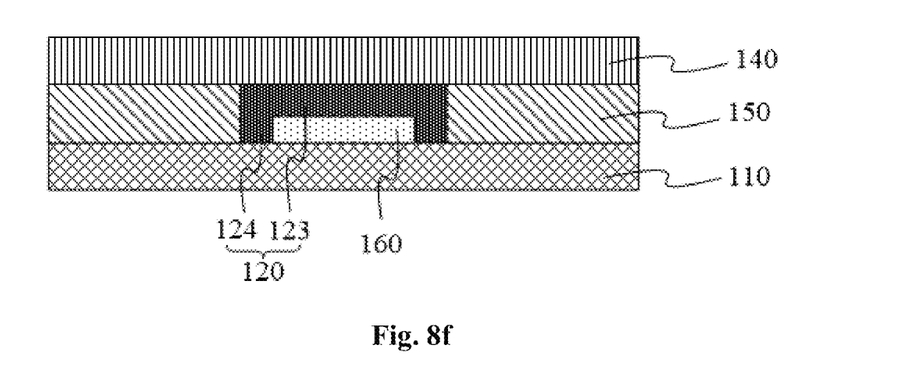
Figure 8G:
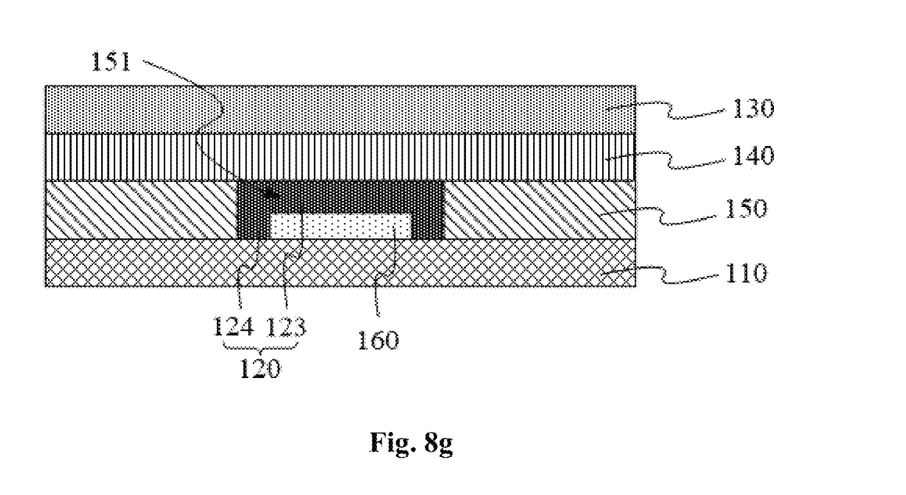

On the basis of FIG. 8*e*, a structure of the insulation layer 140 in FIG. 8*f* may be subsequently formed, and then a structure of the second conductive line 130 in FIG. 8*g* may be formed.

As shown in FIGS. 8*d*-8*e*, the etching the first conductive material layer to form the first conductive line may include etching the first conductive material layer using a half-tone mask plate to remove a portion of the first conductive material layer at a side of the buffer layer away from the base substrate.

In FIG. 8*d*, a depth of a portion of the first conductive material layer 120' to be etched at the target region is greater than a depth of a portion at the other region, the first conductive material layer 120' at different regions may be etched at different etching depths through a half-tone mask plate, so as to finally acquire the first conductive line 120 whose surface away from the base substrate 110 is flush with the surface of the buffer layer 150 away from the base substrate 110 as shown in FIG. 8*e*.

The present disclosure further provides in some embodiments a display device including the above-mentioned display substrate.

The display device may be a display, a mobile phone, a tablet computer, a television, a wearable electronic device, or a navigator.

Unless otherwise defined, any technical or scientific term used herein shall have the common meaning understood by a person of ordinary skills. Such words as "first" and "second" used in the specification and claims are merely used to differentiate different components rather than to represent any order, number or importance. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a first conductive line extending in a first direction on a base substrate, a second conductive line extending in a second direction crossing the first direction on the base substrate, and an insulation layer arranged between the first conductive line and the second conductive line, wherein the display substrate further comprises a buffer layer arranged between the insulation layer and the base substrate, a groove extending in the first direction is formed in the buffer layer, the first conductive line is arranged in the groove, and a surface of the first conductive line away from the base substrate is flush with a surface of the buffer layer away from the base substrate;

wherein a support pattern is further arranged in the groove and at a side of the first conductive line facing the base substrate, the support pattern is a conductive pattern, and an orthogonal projection of the support pattern onto the base substrate is located within an orthogonal projection of the first conductive line onto the base substrate.

2. The display substrate according to claim 1, wherein the first conductive line crosses the second conductive line at a target region, the first conductive line comprises a first portion arranged at the target region and a second portion other than the first portion, and a surface of the first portion in contact with the insulation layer is parallel to the base substrate.

3. The display substrate according to claim 2, wherein a surface of the insulation layer adjacent to the base substrate at the target region is parallel to the base substrate, and a surface of the insulation layer away from the base substrate at the target region is parallel to the base substrate.

4. The display substrate according to claim 1, wherein the first conductive line comprises a third portion and a fourth portion, a surface of the third portion away from the base substrate is flush with a surface of the fourth portion away from the base substrate, and an orthogonal projection of the third portion onto the base substrate coincides with the orthogonal projection of the support pattern onto the base substrate.

5. A method for manufacturing a display substrate, comprising:
providing a base substrate;
forming a first conductive line extending in a first direction on the base substrate;
forming an insulation layer covering the first conductive line on the base substrate; and
forming a second conductive line extending in a second direction crossing the first direction on the insulation layer,
wherein prior to forming the first conductive line extending in the first direction on the base substrate, the method further comprises: forming a buffer material layer on the base substrate; and etching the buffer material layer to form a buffer layer comprising a groove extending in the first direction,
wherein the forming the first conductive line extending in the first direction on the base substrate comprises forming the first conductive line in the groove in such a manner that a surface of the first conductive line away from the base substrate is flush with a surface of the buffer layer away from the base substrate;
wherein prior to forming the buffer material layer on the base substrate, the method further comprises: forming a support material layer on the base substrate; and etching the support material layer to form a support pattern; wherein the support pattern is a conductive pattern;
wherein the etching the buffer material layer to form the buffer layer comprises: etching the buffer material layer to form the buffer layer in such a manner that an orthogonal projection of the support pattern onto the base substrate is located within an orthogonal projection of the groove onto the base substrate.

6. The method according to claim 5, wherein the first conductive line crosses the second conductive line at a target region, the first conductive line comprises a first portion arranged at the target region and a second portion other than the first portion, and a surface of the first portion in contact with the insulation layer is parallel to the base substrate.

7. The method according to claim 6, wherein a surface of the insulation layer adjacent to the base substrate at the target region is parallel to the base substrate, and a surface of the insulation layer away from the base substrate at the target region is parallel to the base substrate.

8. The method according to claim 5, wherein the forming the first conductive line extending in the first direction on the base substrate comprises: forming a first conductive material layer covering the groove on the base substrate; and etching the first conductive material layer to form the first conductive line in such a manner that the orthogonal projection of the support pattern onto the base substrate is located within an orthogonal projection of the first conductive line onto the base substrate.

9. The method according to claim 8, wherein portions of the first conductive line in the groove comprise a third portion and a fourth portion, a surface of the third portion away from the base substrate is flush with a surface of the fourth portion away from the base substrate, and an orthogonal projection of the third portion onto the base substrate coincides with the orthogonal projection of the support pattern onto the base substrate.

10. The method according to claim 8, wherein the etching the first conductive material layer to form the first conductive line comprises etching the first conductive material layer using a half-tone mask plate to remove a portion of the first conductive material layer at a side of the buffer layer away from the base substrate.

11. A display device, comprising a display substrate, wherein the display substrate comprises a first conductive line extending in a first direction on a base substrate, a second conductive line extending in a second direction crossing the first direction on the base substrate, and an insulation layer arranged between the first conductive line and the second conductive line, wherein the display substrate further comprises a buffer layer arranged between the insulation layer and the base substrate, a groove extending in the first direction is formed in the buffer layer, the first conductive line is arranged in the groove, and a surface of the first conductive line away from the base substrate is flush with a surface of the buffer layer away from the base substrate;
wherein a support pattern is further arranged in the groove and at a side of the first conductive line facing the base substrate, the support pattern is a conductive pattern, and an orthogonal projection of the support pattern onto the base substrate is located within an orthogonal projection of the first conductive line onto the base substrate.

12. The display device according to claim 11, wherein the first conductive line crosses the second conductive line at a target region, the first conductive line comprises a first portion arranged at the target region and a second portion other than the first portion, and a surface of the first portion in contact with the insulation layer is parallel to the base substrate.

13. The display device according to claim 12, wherein a surface of the insulation layer adjacent to the base substrate at the target region is parallel to the base substrate, and a surface of the insulation layer away from the base substrate at the target region is parallel to the base substrate.

14. The display device according to claim 11, wherein the first conductive line comprises a third portion and a fourth portion, a surface of the third portion away from the base substrate is flush with a surface of the fourth portion away from the base substrate, and an orthogonal projection of the third portion onto the base substrate coincides with the orthogonal projection of the support pattern onto the base substrate.

* * * * *